(12) United States Patent
Tawara

(10) Patent No.: US 6,386,815 B1
(45) Date of Patent: May 14, 2002

(54) PICK-UP APPARATUS FOR SEMICONDUCTOR CHIPS

(75) Inventor: Kouzou Tawara, Kumamoto (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/487,077

(22) Filed: Jan. 19, 2000

(30) Foreign Application Priority Data

Jan. 20, 1999 (JP) .......................................... 11-011887

(51) Int. Cl.[7] ................................................. B26F 3/00
(52) U.S. Cl. ..................... 414/416.1; 414/411; 414/403; 118/500; 156/584; 156/334; 29/413; 74/56
(58) Field of Search ................................ 414/435, 217, 414/403, 411, 412, 416.1, 787, 939; 187/250; 118/500; 29/413, 426.1, 426.3; 156/584, 344; 74/56

(56) References Cited

U.S. PATENT DOCUMENTS 4,850,780 A * 7/1989 Safabakhsh et al. ..... 414/416.1
5,911,850 A * 6/1999 Zung ....................... 156/584 X
6,106,222 A * 8/2000 Tsuji et al. ............. 414/411 X
6,190,113 B1 * 2/2001 Bui et al. ................ 414/217 X

FOREIGN PATENT DOCUMENTS

JP 0321650 * 12/1989 ................. 414/417
JP 6-318636 11/1994

* cited by examiner

Primary Examiner—Frank E. Werner
(74) Attorney, Agent, or Firm—Hayes Soloway P.C.

(57) ABSTRACT

A pick-up apparatus for picking up semiconductor chips comprising an integrated or a separately rotatable composite cam formed by a plurality of cylindrical cams, and a plurality of cylindrical pin holders having a plurality of push-up pins, and at least part of the pin holder is in contact with the composite cam. The rotation of the composite cam selects one of the pin holders suited for pushing up a desired semiconductor chip, and the counter rotation selects another pin holder suited for another semiconductor chip having a different size. In this manner, a plurality of semiconductor chips having different sizes can be properly picked up without replacing the pin holder.

4 Claims, 5 Drawing Sheets

OUTER PIN IS ASCENDED

INNER PIN IS ASCENDED

PICK-UP APPARATUS FOR SEMICONDUCTOR CHIPS

BACKGROUND OF THE INVENTION

(a) Field of the Invention

The present invention relates to a pick-up apparatus for two or more semiconductor chips having different sizes, and more particularly to apparatus capable of selectively picking-up conductor chips without replacing a pick-up holder for the semiconductor chips.

(b) Description of the Related Art

In the manufacture of semiconductor chips, semiconductor chips are separated by using a full-cut dicing technique from a semiconductor wafer after fabrication of thin film layers thereon. After a specified test, only the qualified chips are picked up from a production line by a push-up pin.

The semiconductor chips to be picked up have different sizes depending on the type of the semiconductor chips.

In a conventional pick-up technique for semiconductor chips, the main purpose is to pick up the semiconductor chips without causing damage thereto as described in JP-A6 (1994)-18636, for example. In the described technique, the chips are picked up and peeled off from an adhesive tape by a push-up pin in a push-up holder. Since the pin pitch of the push-up pin is fixed, the size of the push-up pin must be changed in accordance with the size of the chips, and conventionally a pin holder is replaced with another pin holder having a different pin pitch depending on the chip size. The change of the pushup pin is generally achieved by replacement of the push-up holder and the pin holder as a whole, thus requiring a long period of time. For smoothly conducting the replacement, a plurality of pin holders the number of which is dependent on the chip sizes must be stored and the control of the stocked tools is also required.

Referring to FIGS. 1A and 1B, in a conventional apparatus for picking up semiconductor chips 31a and 31b having different sizes, each of chips 31a and 31b is picked up by each of ascending push-up pins 32a and 32b having a somewhat smaller pin pitch than an outer size of the chips 31a and 31b mounted on each of pin holders 33a and 33b. FIG. 1A shows a larger chip (FIG. 1A) having a pin pitch (La) and FIG. 1B shows a smaller chip having a pin pitch (La) In order to respond to the size change of the chips, the pin holder mounted on the pick-up apparatus is replaced with another having a different size fitting the chip size.

The replacement of the pin holder is quite burdensome to largely lower the fabrication efficiency. Although such a burdensome and low-efficient procedure conducted in a relatively simple operation such as the pick-up of the semiconductor chips is a serious problem, a technique or an apparatus for simply picking up semiconductor chips having different sizes has scarcely attracted attention in the field.

SUMMARY OF THE INVENTION

In view of the foregoing, an object of the present invention is to provide an apparatus for simply and effectively picking up semiconductor chips having different sizes without employing a burdensome and inefficient procedure.

The present invention provides an apparatus for picking up semiconductor chips including a composite cam formed by a plurality of cylindrical cams having different diameters and upward projections out of phase with one another, and a plurality of cylindrical pin holders separately movable in a vertical direction and having a plurality of push-up pins at an upper portion and a plurality of downward projections out of phase with one another; at least part of the pin holder positioned above the composite cam being in contact with the composite cam and the number of the pin holders being the same as that of the cylindrical cams. The plurality of the cylindrical cams forming the composite cam of the present invention may be integrated or separately rotated.

In accordance with the present invention, a specified one of the pin holders which properly picks up a corresponding semiconductor chip can be selected, and even when another chip having a different size is required to be picked up, another pin holder well-fitted for the chip is selected by rotating the composite cam without replacing the pin holder with another one.

In this manner, the replacement between the pin holders each suited for picking up semiconductor chips having different sizes can be eliminated. Accordingly, a period of time and labor required for the replacement can be saved, and the management of elements to be replaced is no longer necessary, and a simple operation of the lever enables the pick-up of a desired semiconductor chip.

The above and other objects, features and advantages of the present invention will be more apparent from the following description.

PREFERRED EMBODIMENTS OF THE INVENTION

Now, the present invention is more specifically described with reference to accompanying drawings.

Figure 1A:
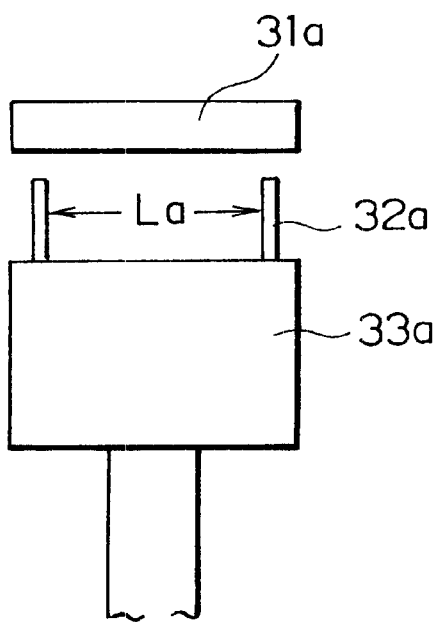
FIG. 1A and 1B are vertical schematic views showing conventional pick-up apparatuses for a larger-scaled semiconductor chip and a smaller-scaled semiconductor chip, respectively.
Figure 1B:
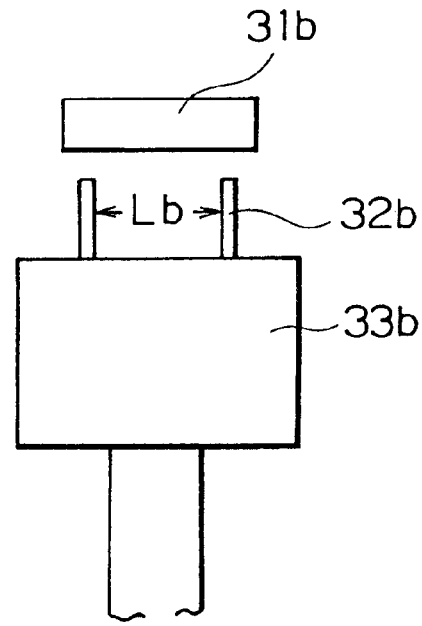
Figure 2:
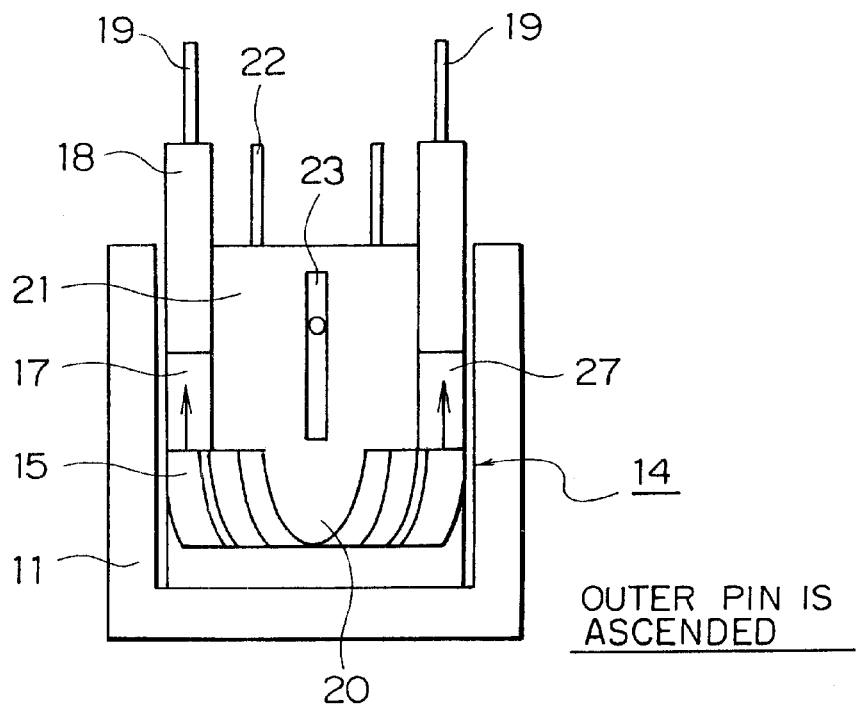
FIG. 2 is a schematic view showing a pick-up apparatus in accordance with an embodiment of the present invention in which an outer pin holder of two pin holders is ascended.
Figure 3:
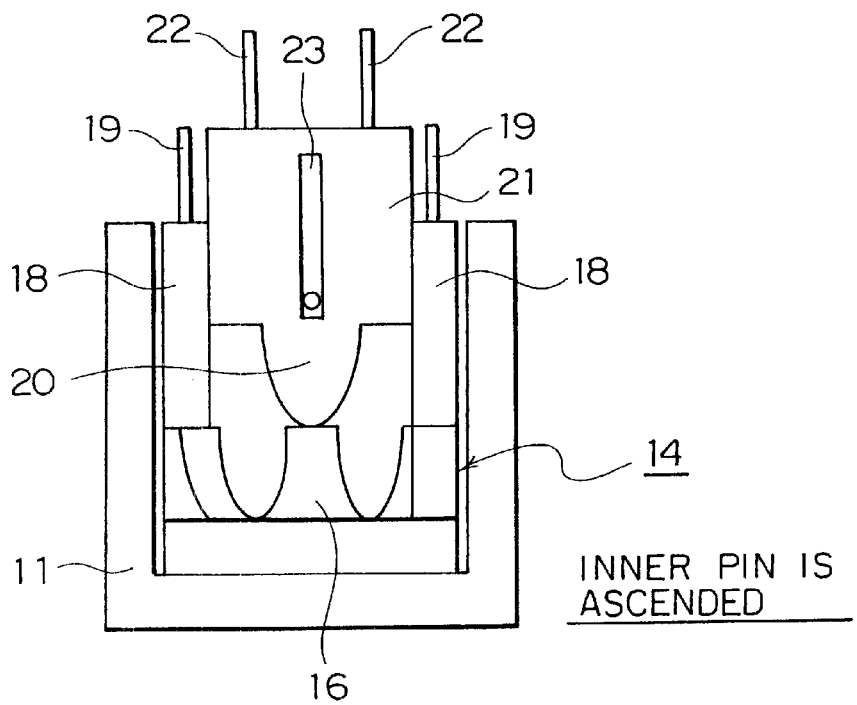
FIG. 3 is a schematic view showing the apparatus of FIG. 2 when an inner pin holder is ascended.
Figure 4:
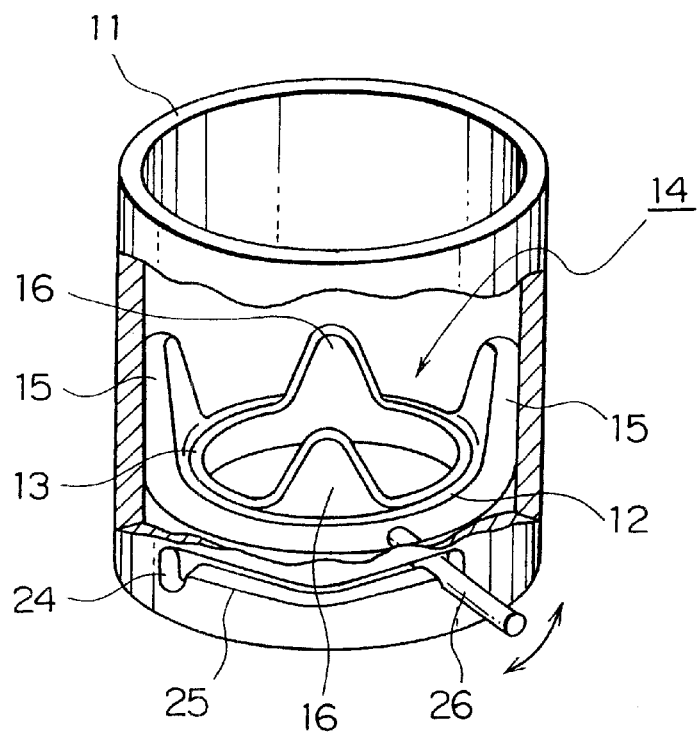
FIG. 4 is a perspective view partly in section showing the apparatus of FIGS. 2 and 3 in which the pin holders are deleted.
Figure 6:
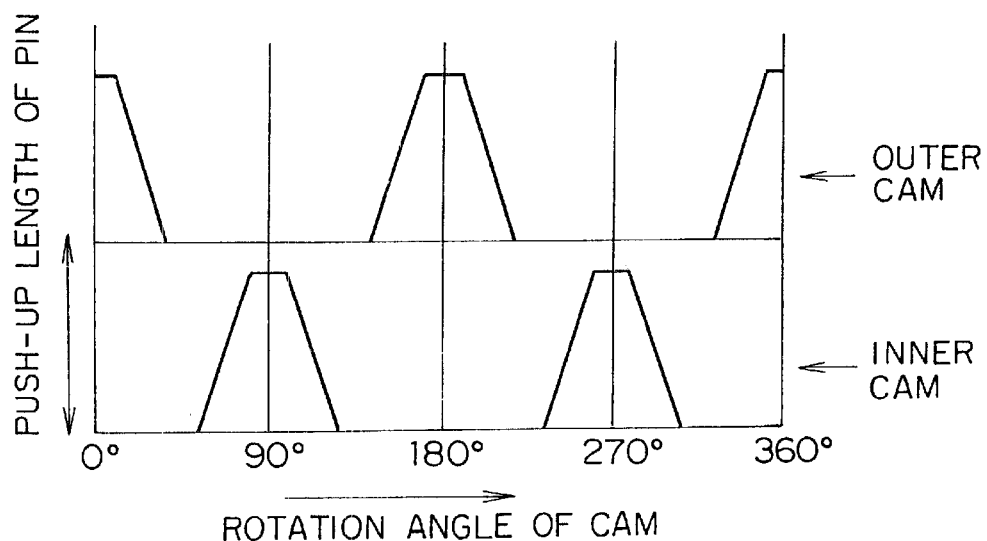
FIG. 6 is a cam diagram of two cylindrical cams.

Referring to FIGS. 2 and 3 showing different states of the operation according to an embodiment of the present invention, a cylindrical pick-up apparatus includes a hollow cylindrical housing 11 having a bottom plate, which receives thereon a composite cam 14 including an outer cylindrical cam 12 and an inner cylindrical cam 13 integrated with each other and being in contact with the inner wall of the housing 11 at the lower part thereof. Referring to FIG. 4, a pair of tapered outer-upward projections 15 separated from each other by 180° and opposing to each other are integrally provided on the top periphery of the outer cylindrical can 12, the tapered projections 15 extending from the bottom thereof toward the top thereof in the radically outward direction. A pair of inner-upward tapered projections 16 separated from each other by 180° and opposing to each other are integrally provided on the top periphery of the inner cylindrical cam 13, the tapered projections 16 extending from the bottom thereof toward the top thereof in the radically outward direction. The outer-upward tapered projections 15 and the inner-upward tapered projections 16 are separated with each other by 90°. As shown in a cam diagram in FIG. 6, the inner cam 12 has a difference of 90° phase with respect to the outer cam 13 and thus when a push-up height by the inner cam 12 becomes to the maximum, that by the outer cam 13 becomes to zero. When the cams are rotated by 90° from the above position by employing a lever, the push-up height by the outer cam 13 becomes to the maximum and that by the inner cam 12 becomes to zero. A length of the push-up (a stroke of the cam) is substantially the same as that of the push-up pin.

Above the outer cylindrical cam 12 is positioned an outer pin holder 18 having, at the bottom portion thereof, two tapered outer-downward projections 17 separated from each other by 180° and the diameter of the outer pin holder 18 is substantially the same as that of the outer cylindrical cam 12. When outer pins 19 mounted on the outer pin holder 18 are ascended as shown in FIG. 2, the outer-downward projections 17 are in contact with the outer-upward projections 15 of the outer cylindrical cam 12.

Above the inner cylindrical cam 13 is positioned an inner pin holder 21 having, at the bottom portion thereof two tapered inner-downward projections 20 separated from each other by 180°, and the diameter of the inner pin holder 21 is substantially the same as that of the inner cylindrical cam 13. When the outer pins 19 mounted on the outer pin holder 18 are ascended as shown in FIG. 2, the inner-downward projections 20 are in contact with the top edge of the inner cylindrical cam 13 having no projections.

When inner pins 22 mounted on the inner pin holder 21 are ascended as shown in FIG. 3, the inner-upward projections 16 are in contact with the inner-downward projections 20 of the inner pin holder 21.

The pin holders 18 and 21 move only in the vertical direction along a shaft 23. The respective front ends of the projections are rounded to make a resistance less when the projections are in contact with another member.

Figure 5:
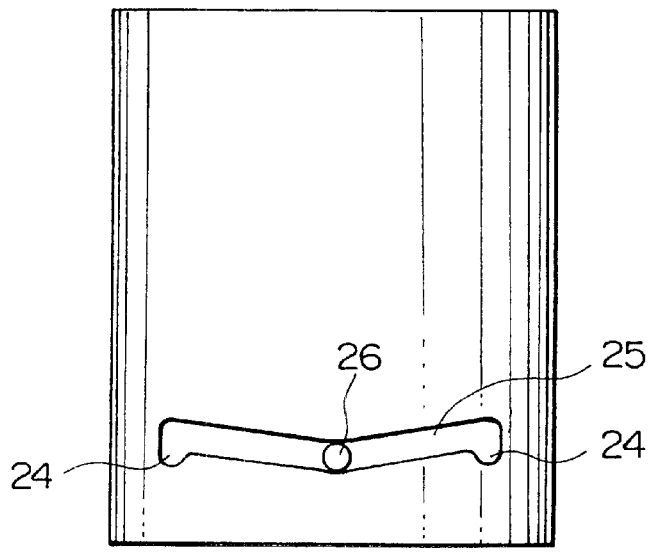
FIG. 5 is a vertical front view showing the apparatus of FIG. 4.

The integrated composite cam 14 is linked with a lever 26 engaged in a lever aperture 25 excavated through the holder wall as shown in FIGS. 4 and 5. The lever aperture 25 extends in the somewhat upward slanting direction from the lowest central portion to the highest two end portions each having a rounded locking part 24. The composite cam 14 rotates within the horizontal length of the lever aperture 25 by employing the lever 26 for pushing up either of the two pin holders 18 and 21 for picking up a corresponding semiconductor chip.

The operation of the apparatus of FIGS. 2 to 5 will be described referring to FIGS. 7 and 8.

Figure 7:
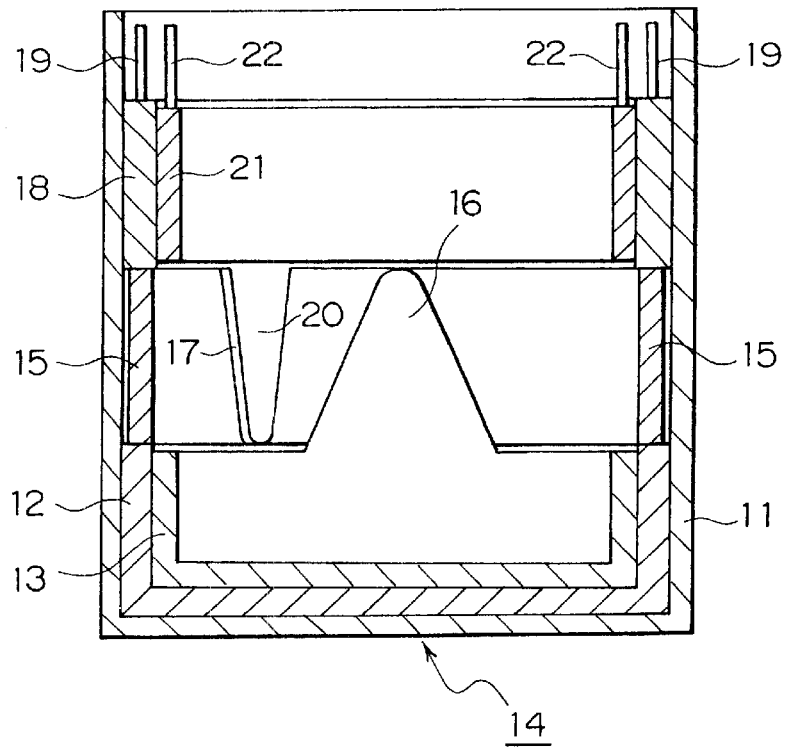
FIG. 7 is a vertical sectional view showing, more in detail, the apparatus of FIGS. 2 to 5 in which neither of the both pin holders are ascended.
Figure 8:
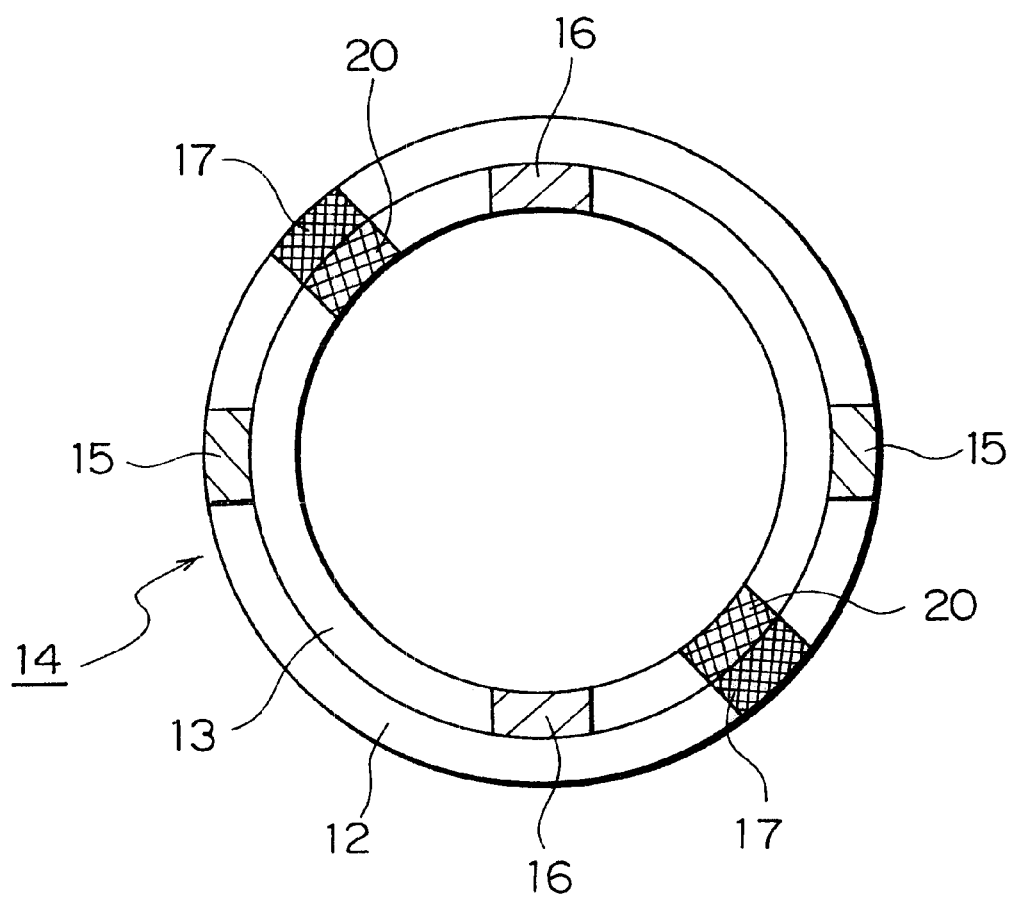
FIG. 8 is a schematic plan view showing a positional relationship among both upward projections and both downward projections of the apparatus of FIG. 7.

The planar positional relationship among the outer cylindrical cam 12, the inner cylindrical cam 13, the outer-upward projections 15, the inner-upward projections 16, the outer-downward projections 17 and the inner-downward projections 20 of the apparatus of FIG. 7 is as shown in FIG. 8. When the integrated composite cam 14 is clockwise rotated from the position shown in FIG. 8, the both outer-upward projections 15 of the outer cylindrical cam 12 are in contact with the outer-downward projections 17 of the outer pin holder 18 to ascend the outer pin holder 18 (the rotation of the composite cam 14 does not change the positions of the outer-downward projections 17 and the inner-downward projections 20). Even if the inner-upward projections 16 of the inner cylindrical cam 13 are clockwise rotated by 45° at this stage, the inner-upward projections 16 are not in contact with the inner-downward projections to ascend the inner pin holder 21. If the integrated composite cam 14 is counterclockwise rotated by 45° from the position of FIG. 8, the both inner-upward projections 16 of the inner cylindrical cam 13 are in contact with the inner-downward projections 20 of the inner pin holder to ascend the inner pin holder 21. The counterclockwise rotation of the outer-upward projections 15 of the outer cylindrical cam 12 by 45° at this stage does not contact the outer-upward projections 15 with the outer-downward projections 17 to ascend the outer pin holder 18.

In this manner, the pin holder to be pushed up can be selected by means of the direction of the rotation of the integrated composite cam 14 by employing the lever 26.

Since the apparatus of the present embodiment is not usually employed under severe conditions such as a large load and a higher temperature, the apparatus can be molded with resin which is economically advantageous.

Since the above embodiments are described only for examples, the present invention is not limited to the above embodiments and various modifications or alternations can be easily made therefrom by those skilled in the art without departing from the scope of the present invention.

What is claimed is:

1. In a push-up pin device for lifting semiconductor chips off a tape, said push-up pin device having a plurality of changeable pin holders each of different pin pitch, the improvement wherein the push-up pin device comprises a hollow cylindrical housing having a bottom plate, which receives thereon a composite cam including a plurality of cylindrical cams having different diameters and respective upward projections having a phase difference from one another, and a plurality of cylindrical pin holders of different pin pitch, each provided for a corresponding one of the cylindrical cams, the pin holders being separately rotatably and vertically movable in said cylindrical housing and having a plurality of push-up pins at an upper portion and a plurality of downward projections which have a phase difference from one another; at least part of the pin holder positioned above the composite cam being in contact with the composite cam.

2. In a push-up pin device according to claim 1, the improvement wherein the composite cam comprises a lever linked with the outermost cylindrical cam and is rotated by employing the lever.

3. In a push-up pin device for lifting semiconductor chips off a tape, said push-up pin device having a plurality of changeable pin holders each of different pin pitch, the improvement wherein the push-up pin device comprises a hollow cylindrical housing having a bottom plate, which receives thereon a composite cam formed by a plurality of separately rotatable cylindrical cams having different diameters and respective upward projections having a phase difference from one another, and a plurality of cylindrical pin holders of different pitch, each provided for a corresponding one of the cylindrical cams, the pin holders being separately rotatably and vertically movable in said cylindrical housing and having a plurality of push-up pins at an upper portion and a plurality of downward projections having a phase difference from one another; at least part of the pin holder positioned above the composite cam being in contact with the composite cam.

4. In a push-up pin device according to claim 3, the improvement wherein the composite cam comprises a plurality of levers each linked with each of the cylindrical cams and any one of the cylindrical cams is rotated by employing the corresponding lever.

* * * * *